US010408860B2

(12) United States Patent
Alvarez Gonzalez et al.

(10) Patent No.: US 10,408,860 B2
(45) Date of Patent: Sep. 10, 2019

(54) INTERCONNECTION SYSTEM WITH FLEXIBLE PINS

(71) Applicant: Intel Corporation, Santa Clara, CA (US)

(72) Inventors: Jorge A. Alvarez Gonzalez, Zapopan (MX); Fernando Gonzalez Lenero, Zapopan (MX); Antonio Zenteno Ramirez, Guadalajara (MX); Fernando Mendoza Hernandez, Guadalajara (MX)

(73) Assignee: Intel Corporation, Santa Clara, CA (US)

( * ) Notice: Subject to any disclaimer, the term of this patent is extended or adjusted under 35 U.S.C. 154(b) by 183 days.

(21) Appl. No.: 15/475,296

(22) Filed: Mar. 31, 2017

(65) Prior Publication Data

US 2018/0284156 A1    Oct. 4, 2018

(51) Int. Cl.
*G01R 31/00* (2006.01)
*G01R 1/073* (2006.01)
(Continued)

(52) U.S. Cl.
CPC ....... *G01R 1/07364* (2013.01); *G01R 1/0416* (2013.01); *H05K 1/115* (2013.01); *H01R 2201/20* (2013.01); *H05K 3/0047* (2013.01); *H05K 2201/09645* (2013.01); *H05K 2201/10295* (2013.01)

(58) Field of Classification Search
CPC ............ G01R 1/06755; G01R 1/06788; G01R 1/07314; G01R 1/06711; G01R 1/07342; G01R 1/07307; G01R 1/07357; G01R 1/06722; G01R 1/06716; G01R 1/07378; G01R 1/0466; G01R 31/2889; (Continued)

(56) References Cited

U.S. PATENT DOCUMENTS 4,498,725 A * 2/1985 Bright ................. H01R 13/193
                                                      439/342
5,046,972 A * 9/1991 Pass ..................... H01R 13/193
                                                      439/249
(Continued)

OTHER PUBLICATIONS

Manikandan et al., "Post Silicon Functional Validation from an Industrial Perspective," Middle-East J. Sci. Res., 15(11), 2013 pp. 1570-1574.

(Continued)

*Primary Examiner* — Thang X Le
(74) *Attorney, Agent, or Firm* — Trop, Pruner & Hu, P.C.

(57) ABSTRACT

An embodiment includes a system comprising: a polymer substrate including a plurality of voids; and a plurality of metal pins; wherein a first pin, included within the plurality of metal pins, includes: (a)(i) first and second arms that couple to each other by way of an arcuate member, (a)(ii) a middle portion including a middle diameter, a proximal portion including a proximal diameter, and a distal portion including a distal diameter; wherein (b)(i) the middle portion is between the proximal and distal portions, (b)(ii) the middle diameter is less than the proximal and distal diameters, and (b)(iii) the proximal portion, but not the distal portion, is included within one of the plurality of voids. Other embodiments are described herein.

23 Claims, 4 Drawing Sheets

(51) Int. Cl.
*H05K 1/11* (2006.01)
*G01R 1/04* (2006.01)
*H05K 3/00* (2006.01)

(58) Field of Classification Search
CPC ............ G01R 31/3627; G01R 31/3682; G01R 31/3696; G01R 31/2831; H01R 43/20
See application file for complete search history.

(56) References Cited

U.S. PATENT DOCUMENTS

| | | | | |
|---|---|---|---|---|
| 5,545,050 | A * | 8/1996 | Sato | G01R 1/0466 439/331 |
| 6,074,233 | A * | 6/2000 | Lin | H01R 13/193 439/342 |
| 6,665,627 | B2 | 12/2003 | Jain | |
| 7,025,602 | B1 * | 4/2006 | Hwang | H01R 13/2421 439/66 |
| 9,526,184 | B2 | 12/2016 | Lecesse | |
| 2009/0017703 | A1 * | 1/2009 | Takahashi | G01R 1/0483 439/824 |
| 2013/0040472 | A1 * | 2/2013 | Gattuso | H01R 12/714 439/66 |

OTHER PUBLICATIONS

Murdock, Tod, "Circular-Based Arches—Part 1: One-Centered and Two-Centered Arches," Website: thisiscarpentry.com, http://www.thisiscarpentry.com/2012/01/06/circular-based-arches-part-1/, 2012, 20 pages.

\* cited by examiner

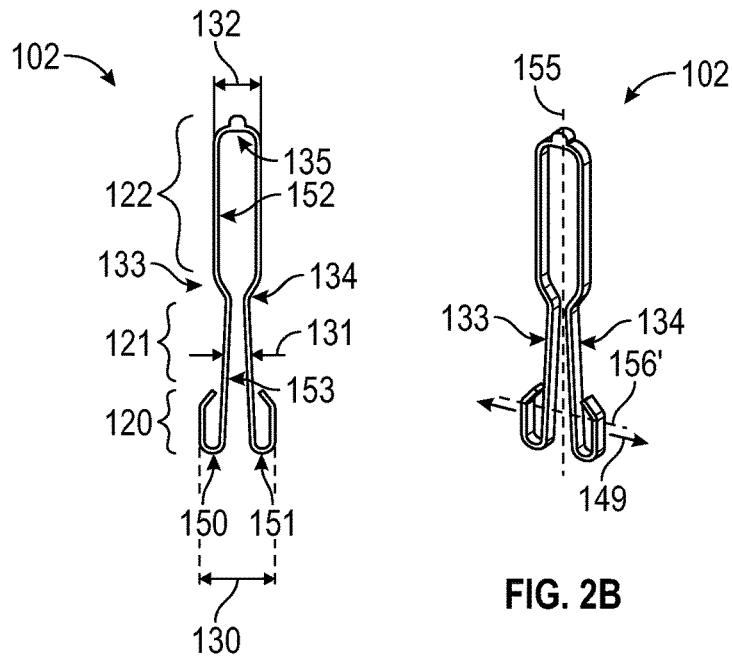
FIG. 2A
FIG. 2B
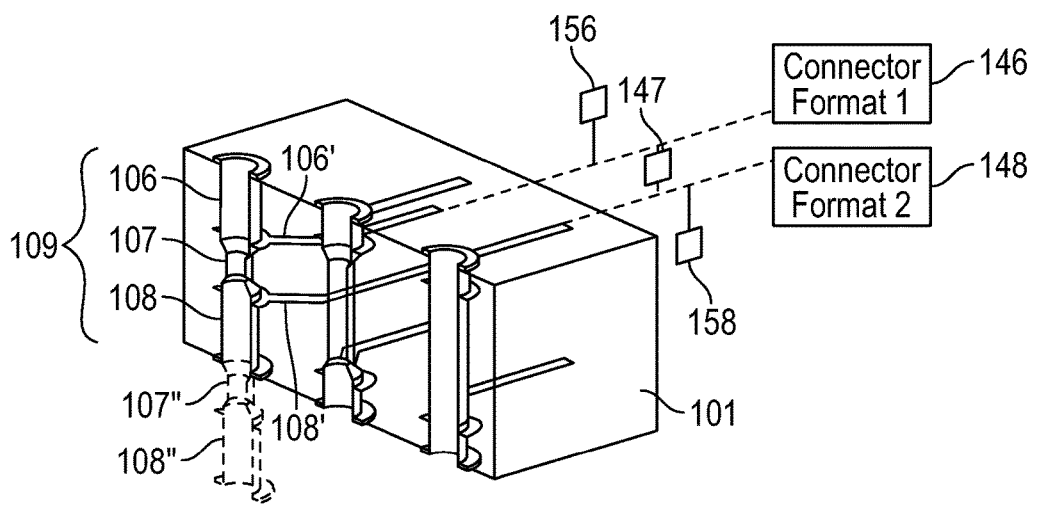
FIG. 3

INTERCONNECTION SYSTEM WITH FLEXIBLE PINS

BACKGROUND

As addressed in U.S. Pat. No. 6,665,627, assigned to Intel Corp. of Santa Clara, Calif., USA, semiconductor device manufacturers often set out with a goal to design, manufacture, and sell a semiconductor device which meets or provides predetermined operating characteristics (e.g., bandwidth, operating voltages, driving currents, rise/fall response times, and the like). The progression towards the goal goes through at least one cycle including many stages. For example, initially there is a virtual design stage where the device is designed virtually in computer programming and simulations (i.e., a pre-silicon stage). This stage is followed by a test production of an actual device in silicon (i.e., a post-silicon stage) which is followed by design validation (DV) testing of the actual post-silicon device. After virtual design and upon DV testing, DV test results may reflect that the design does not exhibit desired or expected characteristics originally designed for in the virtual design. The virtual design may then be tweaked in an attempt to adjust the device to provide desired characteristics, and then test production manufactured again and DV tested once again. Eventually, there is achieved a test production device with DV results having desired characteristics.

BRIEF DESCRIPTION OF THE DRAWINGS

Features and advantages of embodiments of the present invention will become apparent from the appended claims, the following detailed description of one or more example embodiments, and the corresponding figures. Where considered appropriate, reference labels have been repeated among the figures to indicate corresponding or analogous elements.

FIGS. 2A and 2B depict front and perspective views of a flexible pin in an embodiment.

FIG. 3 depicts a validation board with multi-level vias in an embodiment.

DETAILED DESCRIPTION

Figure 1A:
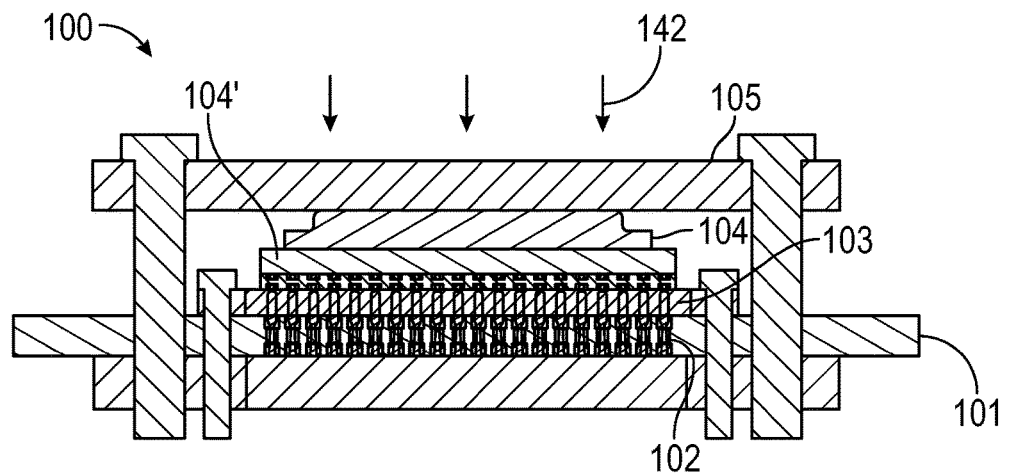
FIGS. 1A and 1B depict a validation system in a first position in an embodiment.

Reference will now be made to the drawings wherein like structures may be provided with like suffix reference designations. In order to show the structures of various embodiments more clearly, the drawings included herein are diagrammatic representations of semiconductor/circuit structures. Thus, the actual appearance of the fabricated integrated circuit structures, for example in a photomicrograph, may appear different while still incorporating the claimed structures of the illustrated embodiments. Moreover, the drawings may only show the structures useful to understand the illustrated embodiments. Additional structures known in the art may not have been included to maintain the clarity of the drawings. For example, not every layer of a semiconductor device is necessarily shown. "An embodiment", "various embodiments" and the like indicate embodiment(s) so described may include particular features, structures, or characteristics, but not every embodiment necessarily includes the particular features, structures, or characteristics. Some embodiments may have some, all, or none of the features described for other embodiments. "First", "second", "third" and the like describe a common object and indicate different instances of like objects are being referred to. Such adjectives do not imply objects so described must be in a given sequence, either temporally, spatially, in ranking, or in any other manner. "Connected" may indicate elements are in direct physical or electrical contact with each other and "coupled" may indicate elements co-operate or interact with each other, but they may or may not be in direct physical or electrical contact.

The increasing demand for circuits (e.g., microprocessors formed in silicon dies), reduced time-to-market for such circuits, and the ever-present pursuit of maximized revenue for organizations that work with such circuits have all combined to make the above mentioned DV process a priority. However, achieving such time and cost savings in DV testing is difficult considering the validation of a new circuit is a costly, complex, and time demanding task based at least in part on the conventional need to design and fabricate at least two types of validation boards: (1) a Modular Design Vehicle (MDV) board for analog validation of the device under test (DUT), and (2) a Design Validation Platform (DVP) board for functional validation of the DUT.

The need for multiple expensive validation boards, such as MDV and DVP boards, is increased when testing high speed signals (e.g., 10 GbE) that communicate with the DUT (e.g., microprocessor in a die). For example, connecting a validation board to different devices (e.g., debug modules and/or recorder modules that record validation data) may require the use of differently formatted connectors (e.g., MNZ and PPV connectors). When these connectors couple to the DUT using high speed interconnects (e.g., vias or traces) a simple switch (e.g., multiplexor) cannot be included on the validation board to simply switch the high speed signals between the two connectors. Doing so would have an adverse effect on signal quality (e.g., signal to noise ratio) caused by the "dead end" associated with the connector that is not being used. Instead, validation engineers conventionally use separate boards (including much of the same design and components) for the two different connectors. This practice is expensive and time consuming.

However, embodiments described herein provide a multiple-interconnection system (e.g., two differently formatted connectors each coupled to high speed traces on a single board) using flexible pins that allow different functionalities in a single validation board. One such flexible pin couples the DUT to multi-level vias in the validation board. The multi-level vias couple to high speed signal interconnects (e.g., traces) on the validation board and those interconnects couple to the differently formatted connectors. As a result, embodiments potentially connect, for example, twice the number of high speed signals to a DUT (as compared to a conventional socket mechanism) in a single validation board (e.g., printed circuit board (PCB)). The flexible pins are actuated by a carriage assembly that moves the pins into a first level of the multilevel vias to connect the DUT to a first connector and then moves the same pins into a second level of the same multilevel vias to connect the DUT to a second connector on the same PCB as the first connector.

Figure 1B:
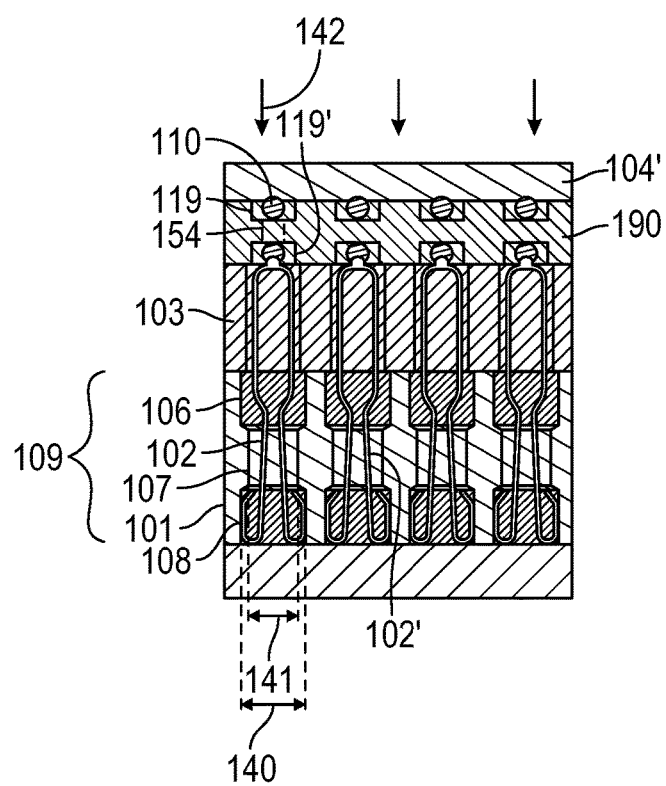
Figure 1C:
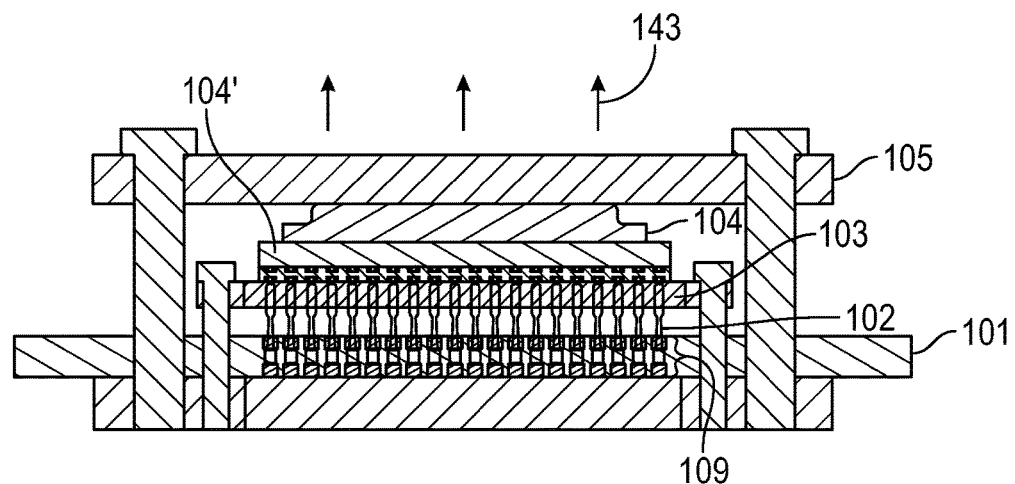
FIGS. 1C and 1D depict a validation system in a second position of the embodiment.
Figure 1D:
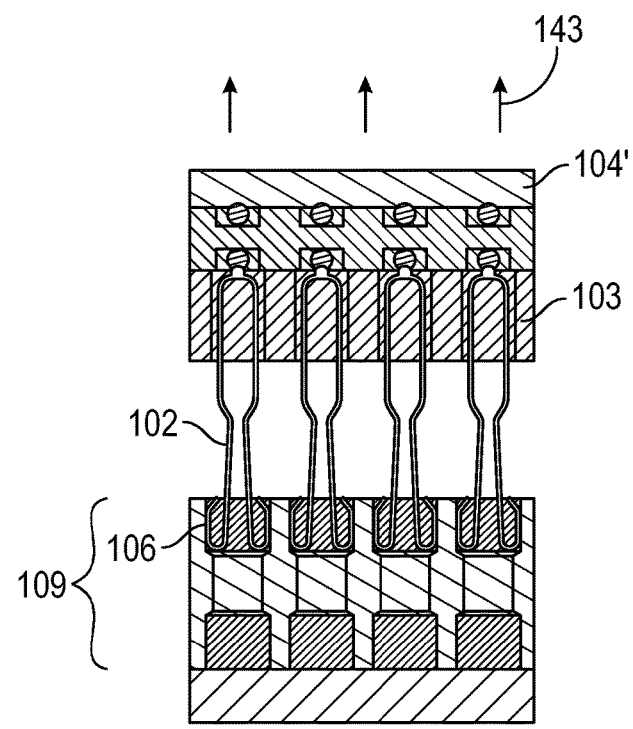

FIGS. 1A and 1B depict a validation system 100 in a position in an embodiment. FIGS. 1C and 1D depict a validation system in another position of the embodiment. FIGS. 1A and 1C show side views of system 100 and FIGS. 1B and 1D show close up views of the pin/via interactions.

System 100 includes a polymer substrate 103. In an embodiment, landing pads 119 (which couple to ball 110 or other such interconnect corresponding to DUT 104) respectively couple to a plurality of voids 119'. A plurality of metal pins 102, 102' couple a DUT 104 to vias 109 of validation board 101. Pin 102 couples to landing pad 119 by way of interconnect (e.g., via) 154.

In another embodiment landing pads 119 are omitted. In such an embodiment ball 110 of DUT 104 couples the DUT 104 to pin 102 and via 109 (and thus validation board 101) using interconnect 154 (e.g., via).

Portion 190 (e.g., substrate including an elastomer) may be affixed to DUT 104 in some embodiments (i.e., will move up and down with DUT 104) or to substrate 103 in other embodiments (i.e., will not move up and down with DUT 104. In some embodiments DUT 104 may include a lower substrate portion 104'. Thus, DUT 104 may include an assembly of components (e.g., interconnects, substrates) that couple to pin 102 and multiple levels of via 109. In some embodiments substrate 103 may include a cylinder (e.g., metal cylinders) that surrounds pin 102. In short, exact substrates and interconnect assemblies may change with the concept remaining the same: DUT 104 has interconnects (e.g., balls 110) that couple directly or indirectly to pin 102 and multiple levels of via 109 when DUT 104 undergoes validation testing. Pin 102 may come in a variety of shapes and forms having, for example, portions that are resiliently biased outwards to make contact with conductive portions of multilevel vias.

Pin 102 is representative of the plurality of pins shown in FIG. 1A-D. As shown in FIGS. 2A-B, pin 102 includes first and second arms 133, 134 that couple to each other by way of arcuate member 135. Pin 102 includes a middle portion 121 including a middle diameter 131, a proximal portion 122 including a proximal diameter 132, and a distal portion 120 including a distal diameter 130. The middle diameter 131 is less than the proximal and distal diameters 132, 130. The form of pin 102 is complementary to multilevel via 109 (FIG. 1B) having upper and lower portions 106, 108 separated by a middle portion 107. Portions 106, 108 include a diameter 140 that is greater than diameter 141 of middle portion 107.

In an embodiment at least one of the middle and proximal portions 121, 122 of pin 102 includes an insulative covering (e.g., applied to pin 102 using plastic injection) (not shown) and the distal portion 120 does not include an insulative covering. This usage of insulative coverings is complementary to via 109 (see FIG. 3). In via 109 proximal via portion 106 includes sidewalls having a proximal metal lining, distal via portion 108 includes sidewalls having a distal metal lining, and middle via portion 107 does not include sidewalls having a metal lining (see FIG. 3). As a result, the proximal metal lining is electrically isolated from the distal metal lining. Having portions of pin 102 covered with an insulative film or layer ensures the signal transmitted to validation board 101 is a signal communicated by distal portion 120 of pin 102 and not from portions 122, 121 of pin 102. Thus, when carriage assembly 105 moves DUT 104 downward 142 (FIG. 1B) so distal pin portion 120 connects with lower level lining of via portion 108, a signal from DUT 104 is communicated by high speed trace 108' to connector 148. And when carriage assembly 105 moves DUT 104 upwards 143 (FIG. 1D) distal pin portion 120 connects with upper level lining of via portion 106 and a signal from DUT 104 is communicated by high speed trace 106' to connector 146. No multiplexor or other signal degradation inducing switch is needed to move between connectors 146, 148, which may be differently formatted from each other (e.g., MNZ and PPV connectors). For example, connectors 146, 148 may comply with different standards. Due to multilevel via 109 first and second connectors 146, 148 are electrically isolated from each other.

As used herein, "electrically isolated" may be mean two nodes are not coupled to each other. For example, the lack of metal lining in portion 107 at least ensures the linings of portions 106, 108 (at least locally) are isolated from each other. Further, connectors 146, 148 are isolated from each other based on the movement of carriage 105. As used herein, "electrically coupling" does not necessarily indicate a flow of electrons must be actively passing between two nodes. For example, connector 147 is electrically coupled to portion 106 by trace 106' even if no current is passing between connector 146 and portion 106. This may also be referred to as two nodes being "conductively coupled" to each other.

To ensure proper signal communication, arms 133, 134 of pin 102 (FIG. 2B) are resiliently biased away 149 from and each other. This allows them to compress when passing through narrowed portion 107 of via 109 and then deploy outwards to make good contact with metal linings in portions 106, 108. While FIG. 2B shows two arms other embodiments may include three, four, five, six or more arms all biased outwards towards sidewalls of the conduit. In an embodiment, the pin may include a conduit with apertures that allow for compression and decompression of the conduit. As a result, the conduit may traverse a narrowed portion of the via that exists between levels of the via.

FIG. 2A shows how in an embodiment a first distal portion of the first arm 133 includes a first additional arcuate member having a first additional arc 150 of at least 100 degrees. A second distal portion of the second arm 134 includes a second additional arcuate member 151 having a second additional arc of at least 100 degrees. Also, arcuate member 135 that couples first arm 133 to the second arm 134 includes an arc of at least 100 degrees. In the embodiment of FIG. 2A each arc of arcuate members 135, 150, 151 are arcs of 180 degrees.

As used herein, "arcuate" means "shaped with a curve or arch" and does not necessarily mean, for example, a constant uniform radius of curvature must be maintained from arm 133 to arm 134 throughout the length of member 135. Instead, arcuate member 135 includes an arc of 180 degrees because it links to vertical members (proximal portions of arms 133, 134) with a curved member (that does not necessarily have to be one centered with a continuous and consistent radius of curvature). For example, the arcuate members may include arches that are semicircular (i.e., one centered), three centered (which does not have a constant radius of curvature), four centered (which does not have a constant radius of curvature), and the like.

In FIG. 2A the first arm 133 includes various linear members 152, 153 that couple the arcuate member 135 to the first additional arcuate member 150. The shaping of the pin provides mechanical integrity that helps provide bias 149 and the ability to resist fatigue over many cycles of toggling between the positions of FIGS. 1B and 1D. Pin 102 may include a high strength copper alloy. In an embodiment the pin is constructed to operate in the elastic zone during cycling between levels of the via and still be able to deform and go back to its original geometry.

In FIG. 2B the first 102 pin includes a long axis 155 extending from the proximal portion 122 to the distal portion 120. An additional axis 156', orthogonal to the long axis 155, intersects the first arm 133 at least two times and the second arm 134 at least two times.

The flexible pins of FIG. 2A may be included in an array connector. These pins may include a metal (e.g., a copper alloy) and the substrate may include a plastic housing.

In FIG. 3, the circuit board 101 includes separate high speed (e.g., 10 GbE) traces 106', 108' for separate connectors 146, 148 (which may couple to different debug modules made by different manufacturers and the like). Connectors may be located on board 101 (despite this case not being shown explicitly in FIG. 3). However, board 101 may have other components 147 (e.g., field programmable gate array (FPGA), voltage regulator) that are shared between the connectors and bus systems. Other components are not necessarily shared. For example, upper via portion 106 may permit communication with a portion of the circuit board (e.g., modules) corresponding to analog validation of a die but not functional validation of the die (see element 156 of FIG. 3), and the distal via portion 108 may electrically couple to another portion of the circuit board (e.g., modules) corresponding functional validation of the die but not analog validation of the die (see element 158 of FIG. 3).

FIG. 1C depicts a first position where carriage assembly 105 locates the distal portion 120 of the first pin in the proximal via portion 106. FIG. 1A depicts a second position where the carriage assembly 105 locates the distal portion 120 of the first pin in the distal via portion 108. The carriage assembly pushes 142 the distal portion of the first pin from the proximal via portion to the distal via portion when transitioning from the first position to the second position and pulls 143 the distal portion of the first pin from the distal via portion to the proximal via portion when transitioning from the second position to the first position.

In FIG. 1A the carriage assembly couples the first pin to connector 148 (see FIG. 3) with a metal trace 108' but electrically isolates the first pin from the connector 146. In the position of FIG. 1C the carriage assembly couples the first pin to the connector 146 with another metal trace 106' but electrically isolates the first pin from the connector 148.

An embodiment may include additional via portions 107" (with no metal lining) and 108" (with a metal lining) to show a via with three levels (see phantom lines in FIG. 3 indicating an alternative embodiment). Other embodiments may include 4, 5, 6 levels or more to couple with one circuit board that respectively takes the place of 4, 5, 6 conventional validation boards or more. Portion 107" may have a smaller diameter than portion 108".

Figure 4:
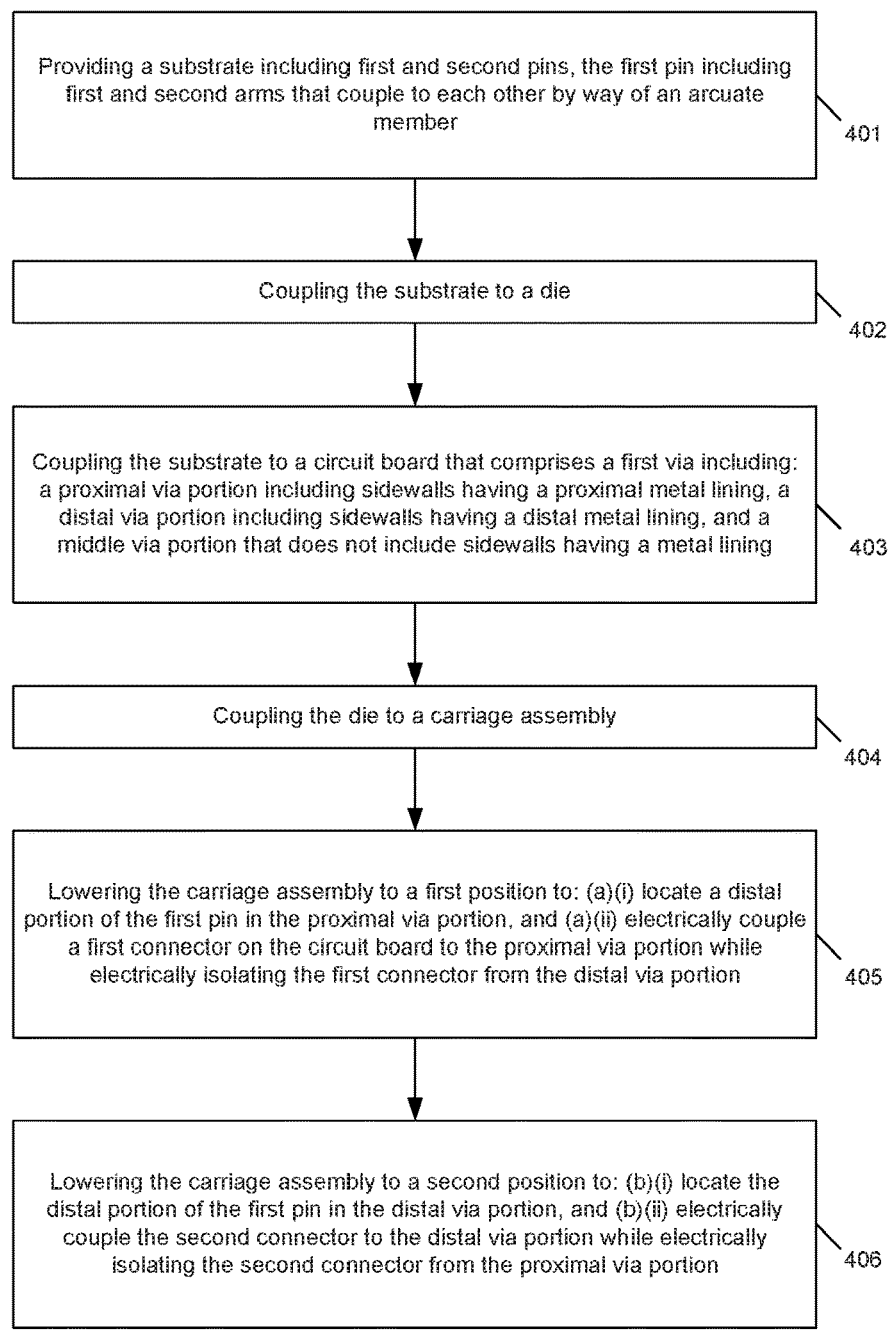
FIG. 4 depicts a method in an embodiment.

FIG. 4 includes a method 400. Block 401 includes providing a substrate including first and second pins, the first pin including first and second arms that couple to each other by way of an arcuate member. Block 402 includes coupling the substrate to a die. Block 403 includes coupling the substrate to a circuit board that comprises a first via including: a proximal via portion including sidewalls having a proximal metal lining, a distal via portion including sidewalls having a distal metal lining, and a middle via portion that does not include sidewalls having a metal lining. Block 404 includes coupling the die to a carriage assembly. Block 405 includes lowering the carriage assembly to a first position to: (a)(i) locate a distal portion of the first pin in the proximal via portion, and (a)(ii) electrically couple a first connector on the circuit board to the proximal via portion while electrically isolating the first connector from the distal via portion (e.g., FIG. 1D). Block 406 includes lowering the carriage assembly to a second position to: (b)(i) locate the distal portion of the first pin in the distal via portion, and (b)(ii) electrically couple the second connector to the distal via portion while electrically isolating the second connector from the proximal via portion (e.g., FIG. 1B).

The multilevel vias of FIG. 3 may be fabricated using different drill sizes deployed to different depths in a PCB. The resulting connection mechanism may form an "hourglass" shape via with two connections: one on the top side of the via and the other one on the bottom side of the via.

This multiple level connectivity feature through a single via has the advantage of routing high speed signals to upper PCB layer or layers as well as to lower PCB layer or layers for the same Z axis space. This is particularly convenient with highly dense areas as ball grid array (BGA) footprints.

Embodiments described herein provide numerous advantages.

First, in conventional practice a board team develops more than one board to validate the same silicon die. This can result in many derivative boards which leads to excessive development time, cost and complexity. However, embodiments provide the capability to include two or more different configurations or derivatives in one board. In an embodiment this is done by using a connector with flexible pins that are able to go through levels of the vias backward and forward. This gives the capacity to use the board on two or more different configurations where the high speed buses are separated from each other on each configuration (see, e.g., traces 106', 108')

Second, in conventional systems debug platforms (external to the validation board) are only able to connect one monitor connector (e.g., LAI, XDP) to a high speed bus (e.g., using a multiplexor (mux) to couple the connectors would degrade signal quality). However, embodiments are able to connect two different monitor connectors (or more) in the same high speed bus (e.g. PCIe, DDR) with an acceptable impact on the signal integrity.

Third, conventional systems create an MDV board (analog validation) and a DVP board (functional validation) to cover the complete validation spectrum. The DVP board tries to reuse Reference Validation Platform (RVP) components and design as much as possible but there is still a gap between both (i.e., there are some specific DVP features that cannot be included in the RVP design). Thus, the validation team still develops an MDV and a DVP validation board since having extra connectors to monitor the high speed signals (used in the MDV) would impact the functionability of the buses. However, with embodiments it is possible to include these extra connectors (that cannot be included in an RVP) into the DVP validation board. Therefore, the validation team will be able to develop only one board for both analog and functional validation, which has aspects that are out of the scope of the RVP design.

The following examples pertain to further embodiments.

Example 1 includes a system comprising: a polymer substrate including a plurality of landing pads respectively coupled to a plurality of voids; and a plurality of metal pins; wherein a first pin, included within the plurality of metal pins, includes: (a)(i) first and second arms that couple to each other by way of an arcuate member, (a)(ii) a middle portion including a middle diameter, a proximal portion including a proximal diameter, and a distal portion including a distal diameter; wherein (b)(i) the middle portion is between the proximal and distal portions, (b)(ii) the middle diameter is less than the proximal and distal diameters, and (b)(iii) the proximal portion, but not the distal portion, is included within one of the plurality of voids.

Another version of example 1 includes a system comprising: a polymer substrate including a plurality of voids; and a plurality of metal pins; wherein a first pin, included within the plurality of metal pins, includes: (a)(i) first and second arms that couple to each other by way of an arcuate member, (a)(ii) a middle portion including a middle diameter, a proximal portion including a proximal diameter, and a distal portion including a distal diameter; wherein (b)(i) the middle portion is between the proximal and distal portions, (b)(ii) the middle diameter is less than the proximal and distal diameters, and (b)(iii) the proximal portion, but not the distal portion, is included within one of the plurality of voids.

The voids of example 1 do not necessarily include space or air but may instead be a space in the substrate and that space may be filled entirely by the pin or a pin and other components.

Another version of example 1 includes a system comprising: a polymer substrate including at least one void; and a plurality of metal pins; wherein a first pin, included within the plurality of metal pins, includes: (a)(i) first and second arms that couple to each other by way of an arcuate member, (a)(ii) a middle portion including a middle diameter, a proximal portion including a proximal diameter, and a distal portion including a distal diameter; wherein (b)(i) the middle portion is between the proximal and distal portions, (b)(ii) the middle diameter is less than the proximal and distal diameters, and (b)(iii) the proximal portion, but not the distal portion, is included within the at least one void.

Example 2 includes the system of example 1 wherein at least one of the middle and proximal portions includes an insulative covering and the distal portion does not include an insulative covering.

Other embodiments may rely on altering the form of the pin (instead of using an insulating layer) to ensure only one level of the via is electrically coupled to a DUT at any point in time.

Example 3 includes the system of example 2 wherein each of the first and second arms are resiliently biased away from and each other.

Example 4 includes the system of example 3 wherein a first distal portion of the first arm includes a first additional arcuate member having a first additional arc of at least 100 degrees; a second distal portion of the second arm includes a second additional arcuate member having a second additional arc of at least 100 degrees; and the arcuate member that couples first arm to the second arm includes an arc of at least 100 degrees.

Another version of Example 4 includes the system of example 3 wherein: a first distal portion of the first arm includes a first additional arcuate member having a first additional arch of at least 100 degrees; a second distal portion of the second arm includes a second additional arcuate member having a second additional arch of at least 100 degrees; and the arcuate member that couples first arm to the second arm includes an arch of at least 100 degrees.

Example 5 includes the system of example 4, wherein: the first arm includes a first linear member that couples the arcuate member to the first additional arcuate member; the second arm includes a second linear member that couples the arcuate member to the second additional arcuate member.

Example 6 includes the system of example 5 a metal interconnect, wherein the first pin couples to at least one of the landing pads by way of the interconnect.

Example 7 includes the system of example 5, wherein: the first pin includes a long axis that extends from the proximal portion to the distal portion; and an additional axis, orthogonal to the long axis, intersects (c)(i) the first arm at least two times, and (c)(ii) the second arm at least two times.

Example 8 includes the system of example 7 comprising: a second pin, included within the plurality of metal pins, which includes: (a)(i) additional first and second arms that couple to each other by way of an additional arcuate member, (a)(ii) an additional middle portion including an additional middle diameter, an additional proximal portion including an additional proximal diameter, and an additional distal portion including an additional distal diameter; wherein the additional middle diameter is less than the additional proximal and distal diameters.

Example 9 includes the system of example 1 comprising: a circuit board comprising a plurality of vias configured to couple to the plurality of pins; wherein a first via, included within the plurality of vias, includes: a middle via portion, a proximal via portion, a distal via portion; wherein the middle via portion is between the proximal and distal via portions; wherein the proximal via portion includes sidewalls having a proximal metal lining, the distal via portion includes sidewalls having a distal metal lining, the middle via portion does not include sidewalls having a metal lining, and the proximal metal lining is electrically isolated from the distal metal lining.

For example, the proximal metal lining is electrically isolated from the distal metal lining because of the middle via portion (which has no interconnect, such as a metal lining, connecting the proximal and distal metal linings).

Example 10 includes the system of example 9 wherein: the middle via portion includes a middle via diameter, the proximal via portion includes a proximal via diameter, and the distal via portion includes a distal via diameter; the middle via diameter is less than the proximal and distal via diameters.

Example 11 includes the system of example 9 comprising first and second connectors, wherein: the first connector is to electrically couple to the proximal via portion but is electrically isolated from the distal via portion; the second connector is to electrically couple to the distal via portion but is electrically isolated from the proximal via portion.

For example, the first connector is to electrically couple to the proximal via portion when a validation board is operating and sending a signal between the first connector and the proximal via portion.

Example 12 includes the system of example 11 wherein: the circuit board includes a member selected from the group consisting of a field programmable gate array (FPGA) and a voltage regulator; and the member is to electrically couple to both of the proximal and distal via portions.

For example, the FPGA is to electrically couple to the proximal via portion when a validation board is operating and sending a signal between the FPGA and the proximal via portion. In another setting or mode, the FPGA is to electrically couple to the distal via portion when a validation board is operating and sending a signal between the FPGA and the distal via portion.

Example 13 includes the system of example 11 comprising a movable carriage assembly, wherein: in a first position the carriage assembly locates the distal portion of the first pin in the proximal via portion; and in a second position the carriage assembly locates the distal portion of the first pin in the distal via portion.

Example 14 includes the system of example 13 wherein: the carriage assembly pushes the distal portion of the first pin from the proximal via portion to the distal via portion when transitioning from the first position to the second position; the carriage assembly pulls the distal portion of the first pin from the distal via portion to the proximal via portion when transitioning from the second position to the first position.

Example 15 includes the system of example 13 wherein in the first position the carriage assembly couples the first pin to the first connector with a metal trace but electrically isolates the first pin from the second connector; and in the second position the carriage assembly couples the first pin to the second connector with another metal trace but electrically isolates the first pin from the first connector.

For example, the first pin is to electrically couple to the first connector when a validation board is operating and sending a signal between the first pin and the first connector.

Example 16 includes the system of example 15, wherein; the first connector includes an array of at least one of male and female interconnects; the second connector includes an array of at least one of male and female interconnects; the first connector complies with a first connector standard and the second connector complies with a second connector standard that is unequal to the first connector standard.

Example 17 includes the system of example 9 wherein: the proximal via portion is to electrically couple to a portion of the circuit board corresponding to one of (c)(i) analog validation of a die, and (c)(ii) functional validation of the die; the distal via portion is to electrically couple to another portion of the circuit board corresponding to another of (c)(i) analog validation of the die, and (c)(ii) functional validation of the die.

Example 18 includes the system of example 9 wherein the first via includes first and second additional via portions, wherein: the first additional via portion is between the middle via portion and the second additional via portion; the second additional via portion is between the first additional via portion and the distal via portion; wherein the first additional via portion includes sidewalls having a first additional metal lining, the second additional via portion does not include sidewalls having a metal lining, and the first additional metal lining is electrically isolated from the distal metal lining.

Example 19 includes the system of example 9 wherein the first via includes first and second additional via portions, wherein: the first additional via portion is between the middle via portion and the second additional via portion; the second additional via portion is between the first additional via portion and the distal via portion; the first additional via portion includes a first additional diameter and the second additional via portion includes a second additional diameter unequal to the first additional diameter.

Example 20 includes a method comprising: providing a substrate including first and second pins, the first pin including first and second arms that couple to each other by way of an arcuate member; coupling the substrate to a die; coupling the substrate to a circuit board that comprises a first via including: a proximal via portion including sidewalls having a proximal metal lining, a distal via portion including sidewalls having a distal metal lining, and a middle via portion that does not include sidewalls having a metal lining; coupling the die to a carriage assembly; lowering the carriage assembly to a first position to locate a distal portion of the first pin in the proximal via portion; and lowering the carriage assembly to a second position to locate the distal portion of the first pin in the distal via portion.

Example 21 includes the method of example 20 comprising: in response to lowering the carriage assembly to the first position, electrically coupling a first connector on the circuit board to the proximal via portion and electrically isolating the first connector from the distal via portion; in response to lowering the carriage assembly to the second position, electrically coupling the second connector to the distal via portion and electrically isolating the second connector from the proximal via portion.

Example 22 includes a system comprising: a substrate including a void; and a first metal pin that includes: (a)(i) first and second arms coupled to each other with an arcuate member, and (a)(ii) proximal, middle, an distal portions; wherein (b)(i) the proximal portion, but not the distal portion, is included within the void; and (b)(ii) each of the first and second arms are resiliently biased away from and each other.

Example 23 includes the system of example 22 wherein at least one of the middle and proximal portions includes an insulative covering and the distal portion does not include an insulative covering.

Example 24 includes the system of example 22 wherein: the middle portion includes a middle diameter, the proximal portion includes a proximal diameter, and the distal portion includes a distal diameter; the middle diameter is less than the proximal and distal diameters.

Example 25 includes the system of example 22 comprising a circuit board including a first via that includes: a middle via portion, a proximal via portion, a distal via portion; wherein the proximal via portion includes sidewalls having a proximal metal lining, the distal via portion includes sidewalls having a distal metal lining, and the middle via portion does not include sidewalls having a metal lining.

Another version of example 25 includes a system comprising: a substrate including a void; and a first metal pin that includes: (a)(i) first and second arms coupled to each other, and (a)(ii) proximal, middle, an distal portions; wherein (b)(i) the proximal portion, but not the distal portion, is included within the void; and (b)(ii) each of the first and second arms are resiliently biased away from and each other.

For instance, the arms may couple to each other without a curved portion.

Example 26 includes the system of example 25 comprising means for electrically isolating the distal portion from the proximal portion.

Example 27 includes the system of example 25 comprising a circuit board including a first via that includes a middle via portion, a proximal via portion, a distal via portion; wherein the first via includes means for electrically isolating the distal via portion from the proximal via portion.

Example 28 includes the system of example 27 comprising means for advancing the first pin between first and second positions wherein: in the first position the distal portion of the first pin is included in the proximal via portion; and in the second position the distal portion of the first pin is included in the distal via portion.

Example 29 includes the system of any one of examples 1 to 7 comprising: a circuit board comprising a plurality of vias configured to couple to the plurality of pins; wherein a first via, included within the plurality of vias, includes: a middle via portion, a proximal via portion, a distal via portion; wherein the middle via portion is between the proximal and distal via portions; wherein the proximal via portion includes sidewalls having a proximal metal lining, the distal via portion includes sidewalls having a distal metal lining, the middle via portion does not include sidewalls having a metal lining, and the proximal metal lining is electrically isolated from the distal metal lining.

Example 30 includes the system of one of examples 8 to 10 comprising a movable carriage assembly, wherein: in a first position the carriage assembly locates the distal portion of the first pin in the proximal via portion; and in a second position the carriage assembly locates the distal portion of the first pin in the distal via portion.

Example 31 includes a system comprising: a substrate including a void; and a first metal interconnect that includes: (a)(i) first and second portions coupled to each other, and (a)(ii) proximal, middle, an distal portions; wherein (b)(i) the proximal portion, but not the distal portion, is included within the void; and (b)(ii) each of the first and second portions are resiliently biased away from and each other.

In an embodiment the first metal interconnect includes a portion of a conduit. For example, the first and second portions may be included in a resilient conduit that has apertures that allow for compression/decompression of the conduit as it traverses narrow portions of a multilevel via. The conduit may include a shape memory material such as Nickel titanium (e.g., Nitinol) or other conductive material (e.g., a gold, copper, and/or nickel alloy).

In an embodiment, the first and second members are linear portions that couple together via a connecting member. The connecting member may be a linear portion of metal that interfaces the linear portions at right angles.

In addition, not all embodiments require vias with portions having different diameters. For example, some embodiments may include vias with proximal and distal portions with conductive linings that are separated by a middle portion with no conductive lining. Pins addressed herein, whether they have 2, 3, 4 or more arms (some of which may be fashioned from a conduit), would still operate with such vias.

The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A system comprising:
a polymer substrate including at least one void; and
a plurality of metal pins;
wherein a first pin, included within the plurality of metal pins, includes: (a)(i) first and second arms that couple to each other by way of an arcuate member, (a)(ii) a middle portion including a middle diameter, a proximal portion including a proximal diameter, and a distal portion including a distal diameter;
wherein (b)(i) the middle portion is between the proximal and distal portions, (b)(ii) the middle diameter is less than the proximal and distal diameters, and (b)(iii) the proximal portion, but not the distal portion, is included within the at least one void.

2. The system of claim 1 wherein at least one of the middle and proximal portions includes an insulative covering and the distal portion does not include an insulative covering.

3. The system of claim 2 wherein each of the first and second arms are resiliently biased away from and each other.

4. The system of claim 3 wherein:
a first distal portion of the first arm includes a first additional arcuate member having a first additional arch of at least 100 degrees;
a second distal portion of the second arm includes a second additional arcuate member having a second additional arch of at least 100 degrees; and
the arcuate member that couples first arm to the second arm includes an arch of at least 100 degrees.

5. The system of claim 4, wherein:
the first arm includes a first linear member that couples the arcuate member to the first additional arcuate member;
the second arm includes a second linear member that couples the arcuate member to the second additional arcuate member.

6. The system of claim 5, wherein:
the first pin includes a long axis that extends from the proximal portion to the distal portion; and
an additional axis, orthogonal to the long axis, intersects (c)(i) the first arm at least two times, and (c)(ii) the second arm at least two times.

7. The system of claim 6 comprising:
a second pin, included within the plurality of metal pins, which includes: (a)(i) additional first and second arms that couple to each other by way of an additional arcuate member, (a)(ii) an additional middle portion including an additional middle diameter, an additional proximal portion including an additional proximal diameter, and an additional distal portion including an additional distal diameter;
wherein the additional middle diameter is less than the additional proximal and additional distal diameters.

8. The system of claim 1 comprising:
a circuit board comprising a plurality of vias configured to couple to the plurality of pins;
wherein a first via, included within the plurality of vias, includes: a middle via portion, a proximal via portion, a distal via portion;
wherein the middle via portion is between the proximal and distal via portions;
wherein the proximal via portion includes sidewalls having a proximal metal lining, the distal via portion includes sidewalls having a distal metal lining, the middle via portion does not include sidewalls having a metal lining, and the proximal metal lining is electrically isolated from the distal metal lining.

9. The system of claim 8 wherein:
the middle via portion includes a middle via diameter, the proximal via portion includes a proximal via diameter, and the distal via portion includes a distal via diameter;
the middle via diameter is less than the proximal and distal via diameters.

10. The system of claim 8 comprising first and second connectors, wherein:
a first connector is to electrically couple to the proximal via portion but is electrically isolated from the distal via portion;
a second connector is to electrically couple to the distal via portion but is electrically isolated from the proximal via portion.

11. The system of claim 10 wherein:
the circuit board includes at least one of a field programmable gate array (FPGA) or a voltage regulator; and
the member is to electrically couple to both of the proximal and distal via portions.

12. The system of claim 10 comprising a movable carriage assembly, wherein:
in a first position the carriage assembly locates the distal portion of the first pin in the proximal via portion; and
in a second position the carriage assembly locates the distal portion of the first pin in the distal via portion.

13. The system of claim 12 wherein:
the carriage assembly pushes the distal portion of the first pin from the proximal via portion to the distal via portion when transitioning from the first position to the second position;
the carriage assembly pulls the distal portion of the first pin from the distal via portion to the proximal via portion when transitioning from the second position to the first position.

14. The system of claim 12 wherein:
in the first position the carriage assembly couples the first pin to the first connector with a metal trace but electrically isolates the first pin from the second connector; and
in the second position the carriage assembly couples the first pin to the second connector with another metal trace but electrically isolates the first pin from the first connector.

15. The system of claim 14, wherein:
the first connector includes an array of at least one of male or female interconnects;
the second connector includes an array of at least one of male or female interconnects;
the first connector complies with a first connector standard and the second connector complies with a second connector standard that is unequal to the first connector standard.

16. The system of claim 8 wherein:
the proximal via portion is to electrically couple to a portion of the circuit board corresponding to one of (c)(i) analog validation of a die, or (c)(ii) functional validation of the die;
the distal via portion is to electrically couple to another portion of the circuit board corresponding to another of (c)(i) analog validation of the die, or (c)(ii) functional validation of the die.

17. The system of claim 8 wherein the first via includes first and second additional via portions, wherein:
the first additional via portion is between the middle via portion and the second additional via portion;
the second additional via portion is between the first additional via portion and the distal via portion;
the first additional via portion includes sidewalls having a first additional metal lining, the second additional via portion does not include sidewalls having a metal lining, and the first additional metal lining is electrically isolated from the distal metal lining.

18. The system of claim 8 wherein the first via includes first and second additional via portions, wherein:
the first additional via portion is between the middle via portion and the second additional via portion;
the second additional via portion is between the first additional via portion and the distal via portion;
the first additional via portion includes a first additional diameter and the second additional via portion includes a second additional diameter unequal to the first additional diameter.

19. A method comprising:
providing a substrate including first and second pins, the first pin including first and second arms that couple to each other by way of an arcuate member;
coupling the substrate to a die;
coupling the substrate to a circuit board that comprises a first via, the first via including: a proximal via portion including sidewalls having a proximal metal lining, a distal via portion including sidewalls having a distal metal lining, and a middle via portion that does not include sidewalls having a metal lining;
coupling the die to a carriage assembly;
lowering the carriage assembly to a first position to locate a distal portion of the first pin in the proximal via portion; and
lowering the carriage assembly to a second position to locate the distal portion of the first pin in the distal via portion.

20. The method of claim 19 comprising:
in response to lowering the carriage assembly to the first position, electrically coupling a first connector on the circuit board to the proximal via portion and electrically isolating the first connector from the distal via portion;
in response to lowering the carriage assembly to the second position, electrically coupling a second connector to the distal via portion and electrically isolating the second connector from the proximal via portion.

21. A system comprising:
a circuit board including a first via, the first via including a middle via portion, a proximal via portion, and a distal via portion;
a substrate including a void; and
a first metal pin that includes: (a)(i) first and second arms coupled to each other with an arcuate member, (a)(ii) a proximal portion, a middle portion, and a distal portion;
wherein (b)(i) the proximal portion, but not the distal portion, is included within the void; and (b)(ii) each of the first and second arms are resiliently biased away from and each other;
wherein the proximal via portion includes sidewalls having a proximal metal lining, the distal via portion includes sidewalls having a distal metal lining, and the middle via portion does not include sidewalls having a metal lining.

22. The system of claim 21 wherein at least one of the middle or proximal portions includes an insulative covering and the distal portion does not include an insulative covering.

23. The system of claim 21 wherein:
the middle portion includes a middle diameter, the proximal portion includes a proximal diameter, and the distal portion includes a distal diameter;
the middle diameter is less than the proximal and distal diameters.

* * * * *